United States Patent
Hara et al.

(10) Patent No.: US 8,349,283 B2
(45) Date of Patent: Jan. 8, 2013

(54) METAL RECOVERY METHOD, METAL RECOVERY APPARATUS, GAS EXHAUST SYSTEM AND FILM FORMING DEVICE USING SAME

(75) Inventors: Masamichi Hara, Nirasaki (JP); Atsushi Gomi, Nirasaki (JP); Tatsuo Hatano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 52 days.

(21) Appl. No.: 13/058,243

(22) PCT Filed: Aug. 4, 2009

(86) PCT No.: PCT/JP2009/063810
§ 371 (c)(1),
(2), (4) Date: Apr. 29, 2011

(87) PCT Pub. No.: WO2010/018768
PCT Pub. Date: Feb. 18, 2010

(65) Prior Publication Data
US 2011/0206585 A1   Aug. 25, 2011

(30) Foreign Application Priority Data
Aug. 9, 2008   (JP) ................. 2008-206474

(51) Int. Cl.
*B01D 50/00* (2006.01)
*B01D 53/64* (2006.01)
*H01L 21/20* (2006.01)

(52) U.S. Cl. ............ 423/215.5; 422/170; 427/248.1; 118/715; 118/723 R; 438/478; 438/800

(58) Field of Classification Search ........... 423/215.5; 422/170; 427/248.1; 118/715, 723 R; 438/478, 438/800
See application file for complete search history.

(56) References Cited

U.S. PATENT DOCUMENTS

| | | |
|---|---|---|
| 2001/0036509 A1 | 11/2001 | Kitada et al. |
| 2003/0223929 A1* | 12/2003 | Kokun et al. ............. 423/240 S |
| 2004/0081607 A1 | 4/2004 | Hasegawa |
| 2004/0129138 A1 | 7/2004 | Otsuka et al. |
| 2010/0015799 A1 | 1/2010 | Kojima et al. |

(Continued)

FOREIGN PATENT DOCUMENTS

JP   10 263355   10/1998

(Continued)

OTHER PUBLICATIONS

International Search Report issued Nov. 17, 2009 in PCT/JP09/063810 filed Aug. 4, 2009.

*Primary Examiner* — Timothy Vanoy
(74) *Attorney, Agent, or Firm* — Oblon, Spivak, McClelland, Maier & Neustadt, L.L.P.

(57) ABSTRACT

A metal recovery apparatus recovers metal components from an exhaust gas exhausted from a processing chamber in which a thin film is formed on the surface of a target substrate by using a source gas formed of an organic metal compound serving as a source, and scrubs the exhaust gas. The metal recovery apparatus 66 includes a trap unit having an adsorption member for attaching thereon metal components included in the source gas by heating the exhaust gas and thus thermally decomposing an unreacted source gas included in the exhaust gas; and the scrubbing unit including a catalyzer for oxidizing and thus scrubbing harmful gas components included in the exhaust gas that has flowed through the trap unit.

26 Claims, 5 Drawing Sheets

U.S. PATENT DOCUMENTS

2011/0020544 A1 1/2011 Matsumoto
2011/0206585 A1* 8/2011 Hara et al. ................. 423/215.5

FOREIGN PATENT DOCUMENTS

| | | |
|---|---|---|
| JP | 2001 214272 | 8/2001 |
| JP | 2001 342566 | 12/2001 |
| JP | 2003 105543 | 4/2003 |
| JP | 2004 202421 | 7/2004 |
| JP | 2005 3331 | 1/2005 |
| JP | 2005 185961 | 7/2005 |
| JP | 2007 39751 | 2/2007 |
| JP | 2008 28059 | 2/2008 |
| JP | 2009 62599 | 3/2009 |
| WO | 2007 004808 | 1/2007 |

* cited by examiner

METAL RECOVERY METHOD, METAL RECOVERY APPARATUS, GAS EXHAUST SYSTEM AND FILM FORMING DEVICE USING SAME

FIELD OF THE INVENTION

The present invention relates to a metal recovery method, a metal recovery apparatus, a gas exhaust system and a film forming device using the same, for recovering metal components from an unreacted source gas of the exhaust gas exhausted from the film forming device.

BACKGROUND OF THE INVENTION

In general, a film forming process for forming a desired thin film on a semiconductor wafer, an LCD substrate or the like and a pattern etching process for etching a desired pattern thereon are repeatedly performed to manufacture an integrated circuit (IC) or a logic device.

For example, in the case of the film forming process, a silicon thin film, a silicon oxide thin film, a silicon nitride thin film, a metal thin film, a metal oxide thin film, a metal nitride thin film or the like is formed on the surface of a target substrate to be processed by allowing a predetermined processing gas (source gas) to react in the processing chamber. As such, when such film forming reaction is performed, residual reaction byproducts are produced and exhausted along with the exhaust gas. Further, an unreacted processing gas is also exhausted.

If the reaction byproducts and the unreacted processing gas are exhausted to the atmosphere as they are, they cause an environmental pollution. In order to prevent such environmental pollution, a trap mechanism is typically provided in a gas exhaust system extended from the processing chamber to trap and remove the reaction byproducts, the unreacted processing gas and the like included in the exhaust gas.

The configuration of the trap mechanism is varied depending on the properties of the reaction byproducts or the like to be trapped and removed. For example, in the case of removing the reaction byproducts that are condensed (liquefied) or coagulated (solidified) at a room temperature, the trap mechanism has, e.g., a configuration in which a plurality of fins is provided in a casing including an introduction port and an exhaust port of the exhaust gas. The fins are arranged in the direction along which the exhaust gas flows. When the exhaust gas passes between the fins, the reaction byproducts or the like included in the exhaust gas are attached on surfaces of the fins to be trapped and removed.

In this regard, the fins are cooled by a cooling medium or the like to improve the trap efficiency (see, e.g., JP2001-214272A). Further, there has been proposed a recovery method in which a scrubber for scattering water is used as the trap mechanism, and the exhaust gas is contacted with the scattered water so that the reaction byproducts and/or the unreacted gas components are dissolved in the scattered water to be recovered.

There is another trap mechanism in which a detachably disposable cartridge-type absorption tower is provided to absorb therein the reaction byproducts and/or the unreacted gas components to remove them from the exhaust gas. In the trap mechanism, if the removing capacity of the absorption tower is reduced to a predetermined level, the absorption tower is wasted and replaced with a new absorption tower. The reason that the used absorption tower is wasted is because it is relatively difficult to recover a useful metal from the trapped reaction byproducts in case where halogen elements such as fluorine (F), chlorine (Cl) or the like are included in the source gas.

Further, harmful gas components may be included in the gas exhausted from the trap mechanism. The harmful gas components are scrubbed by a scrubbing unit provided at a downstream side (rear end) of the trap mechanism. Then, the exhaust gas is exhausted to the atmosphere.

Recently, a thin film is formed by a film forming device by using an organic metal compound source gas containing a precious metal such as silver, gold, ruthenium or the like in order to reduce the wiring resistance or the contact resistance. Such precious metal is very expensive. Moreover, some of sources of the aforementioned organic metal compound may contain carbon, hydrogen, oxygen and the like in addition to metal atoms but does not contain halogen elements such as F, Cl and the like. Accordingly, if such trap method using a disposable trap unit is employed, the expensive metals are uselessly wasted, causing an increase in the running cost.

For that reason, in, e.g., JP2001-342566A, to improve the effective use of the precious metals or expensive metals, there has been suggested a recover method for trapping reaction byproducts containing an unreacted source by cooling and thus, e.g., condensing the exhaust gas exhausted from the processing gas; and obtaining the unreacted source by refining the reaction byproducts. Since, however, the reaction byproducts and the unreacted source are trapped together in the trap method disclosed in JP2001-342566A, it is necessary to perform the refining process for obtaining the unreacted source thereafter, thereby resulting in the troublesome work.

Further, the conventional scrubber or the trap mechanism using the fins is disadvantageous in that it is required to include a separate scrubbing unit and, thus, its install space becomes increased.

SUMMARY OF THE INVENTION

In view of the above, the present invention provides a metal recovery method, a metal recovery apparatus, an exhaust system and a film forming device using the same, capable of recovering metal components from an exhaust gas exhausted from a processing chamber in which a thin film is formed on a surface of a target substrate to be processed and scrubbing the exhaust gas with a space-saving simple structure.

In accordance with an aspect of the present invention, there is provided a metal recovery method for recovering metal components from an exhaust gas exhausted from a processing chamber in which a thin film is formed on a surface of a target substrate by using a source gas formed of an organic metal compound serving as a source, and scrubbing the exhaust gas. The method includes a trap process which thermally decomposes an unreacted source gas included in the exhaust gas by bringing the exhaust gas into contact with a heated absorption member and thus allows metal components included in the source gas to be attached on the absorption member; and a scrubbing process which oxidizes and thus scrubs harmful gas components included in the exhaust gas that has been subjected to the trap process by bringing the exhaust gas into contact with a catalyzer.

As such, when the metal components are recovered from the exhaust gas exhausted from the processing chamber in which a thin film is formed on a surface of a target substrate by using the source gas formed of the organic metal compound serving as the source, the exhaust gas is subjected to both the trap process which thermally decomposes an unreacted source gas included in the exhaust gas by bringing the exhaust gas into contact with the heated absorption member and thus allows the metal components included in the source gas to be attached on the absorption member; and the scrubbing process which oxidizes and thus scrubs harmful gas components included in the exhaust gas that has been subjected to the trap process by bringing the exhaust gas into contact with the catalyzer. Accordingly, it is possible to recover the metal components from the exhaust gas exhausted from the processing chamber in which a thin film is formed on a surface of a target substrate, and scrub the exhaust gas.

Further, since the recovered metal components are re-used without being wasted, the running cost can be reduced accordingly. Besides, to re-use the metal components, it is not required to perform a complex purifying operation, and it is possible to simply obtain the metal components as the source.

The scrubbing process may be performed under the existence of an oxidizing gas.

The trap process may be performed under the existence of an oxidizing gas.

A temperature of the catalyzer may be set to range from 600 to 800° C. in the scrubbing process.

Further, a temperature of the adsorption member may be set to range from 600 to 1000° C. in the trap process The catalyzer may be formed of at least one selected from a group consisting of $MnO_2$, CaO, MgO, $HfO_2$ and $Ta_2O_5$.

The oxidizing gas is formed of at least one selected from a group consisting of $O_2$, $O_3$, $H_2O$ and an air.

The organic metal compound may include at least one selected from a group consisting of $Ru_3(CO)_{12}$, tetrakis(ethylmethylamino)titanium(Ti[N($C_2H_5CH_3$)$_2$]$_4$ (TEMAT), tert-amylimidotrisdim-ethylamidotantalum (TAIMATA), Cu(EDMDD)$_2$, W(CO)$_6$, $TaCl_5$, trimethyl aluminum (TMA), tert-butylimidotris(diethylamido)tantalum (TBTDET), polyethylene terephthalate (PET), tetramethylsilane (TMS), tetrakisethoxy hafnium (TEH), $CP_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)_2]$, $MeCpMn(CO)_3[=(CH_3C_5H_4)Mn(CO)_3]$, $(t-BuCP)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, and $Mn(acac)_3[=Mn(C_5H_7O_2)_3]$.

The organic metal compound may be $Ru_3(CO)_{12}$, and an exhaust gas exhausted from the scrubbing process may be $CO_2$ gas.

In accordance with another aspect of the present invention, there is provided a metal recovery apparatus for recovering metal components from an exhaust gas exhausted from a processing chamber in which a thin film is formed on a surface of a target substrate by using a source gas formed of an organic metal compound serving as a source, and scrubbing the exhaust gas. The apparatus includes a trap unit including an adsorption member for attaching thereon metal components included in the source gas by heating the exhaust gas and thus thermally decomposing an unreacted source gas included in the exhaust gas; and a scrubbing unit including a catalyzer for oxidizing and thus scrubbing harmful gas components included in the exhaust gas that has flowed through the trap unit.

In the metal recovery apparatus for recovering metal components from the exhaust gas exhausted from the processing chamber in which a thin film is formed on a surface of a target substrate by using the source gas formed of the organic metal compound source, the trap unit including the adsorption member for attaching thereon the metal components included in the source gas by exposing the exhaust gas to high temperature and thus thermally decomposing the unreacted source gas included in the exhaust gas is integrated with the scrubbing unit including the catalyzer for oxidizing and thus scrubbing harmful gas components included in the exhaust gas that has flowed through the trap unit. Accordingly, it is possible to significantly reduce the installation space.

The trap unit and the scrubbing unit may be successively arranged in a housing in a flowing direction of the exhaust gas.

The trap unit may further include an adsorption member heater for heating the adsorption member.

The scrubbing unit may further include a catalyzer heater for heating the catalyzer.

The adsorption member may include a plurality of adsorption pieces accommodated in a casing.

The adsorption member may include a plurality of wire nets arranged in a flowing direction of the exhaust gas.

The adsorption member may include a plurality of plates with vent holes arranged in a flowing direction of the exhaust gas.

The metal recovery apparatus may further include an oxidizing gas supply mechanism for supplying an oxidizing gas toward the trap unit.

The metal recovery apparatus may further include an oxidizing gas supply mechanism for supplying an oxidizing gas toward the scrubbing unit.

A temperature of the catalyzer may be set to range from 600 to 800° C.

A temperature of the adsorption member may be set to range from 600 to 1000° C.

The catalyzer may be formed of at least one selected from a group consisting of $MnO_2$, CaO, MgO, $HfO_2$ and $Ta_2O_5$.

The oxidizing gas is formed of at least one selected from a group consisting of $O_2$, $O_3$, $H_2O$ and an air.

In the metal recovery apparatus, the organic metal compound may include at least one selected from a group consisting of $Ru_a(CO)_{12}$, tetrakis(ethylmethylamino)titanium (Ti[N($C_2H_5CH_3$)$_2$]$_4$ (TEMAT) tert-amylimidotrisdim-ethylamidotantalum (TAIMATA), Cu(EDMDD)$_2$, W(CO)$_6$, $TaCl_5$, trimethyl aluminum (TMA), tert-butylimidotris(diethylamido)tantalum (TBTDET), polyethylene terephthalate (PET), tetramethylsilane (TMS), tetrakisethoxy hafnium (TEH), $CP_2Mn[=Mn(C_5H_5)_2]$, $(MeCp)_2Mn[=Mn(CH_3C_5H_4)_2]$, $(EtCp)_2Mn[=Mn(C_2H_5C_5H_4)_2]$, $(i-PrCp)_2Mn[=Mn(C_3H_7C_5H_4)_2]$, $MeCpMn(CO)_3[=(CH_3C_5H_4)Mn(CO)_3]$, $(t-BuCP)_2Mn[=Mn(C_4H_9C_5H_4)_2]$, $CH_3Mn(CO)_5$, $Mn(DPM)_3[=Mn(C_{11}H_{19}O_2)_3]$, $Mn(DMPD)(EtCp)[=Mn(C_7H_{11}C_2H_5C_5H_4)]$, $Mn(acac)_2[=Mn(C_5H_7O_2)_2]$, $Mn(DPM)_2[=Mn(C_{11}H_{19}O_2)_2]$, and $Mn(acac)_3[=Mn(C_5H_7O_2)_3]$.

The organic metal compound may be $Ru_3(CO)_{12}$, and an exhaust gas exhausted from the scrubbing unit may be $CO_2$ gas.

In accordance with still another aspect of the present invention, there is provided a gas exhaust system, which is connected to a processing chamber in which a thin film is formed on a surface of a target substrate by using a source gas formed of an organic metal compound serving as a source, for recovering metal components from an exhaust gas exhausted from the processing gas, and scrubbing the exhaust gas. The system includes an exhaust path connected to a gas exhaust port of the processing chamber; a vacuum pump arranged in the exhaust path; and the metal recovery apparatus arranged in the exhaust path in accordance with the aspect of the present invention.

In accordance with still another aspect of the present invention, there is provided a film forming device for forming a thin film on a target substrate. The device includes an evacuatable processing chamber; a holding unit for holding the target substrate in the processing chamber; a heater for heating the target substrate; a gas introduction mechanism for introducing a gas into the processing chamber; a source gas supply system connected to the gas introduction mechanism; and the gas exhaust system connected to the processing chamber in accordance with the aspect of the present invention.

DETAILED DESCRIPTION OF THE EMBODIMENTS

Figure 1:
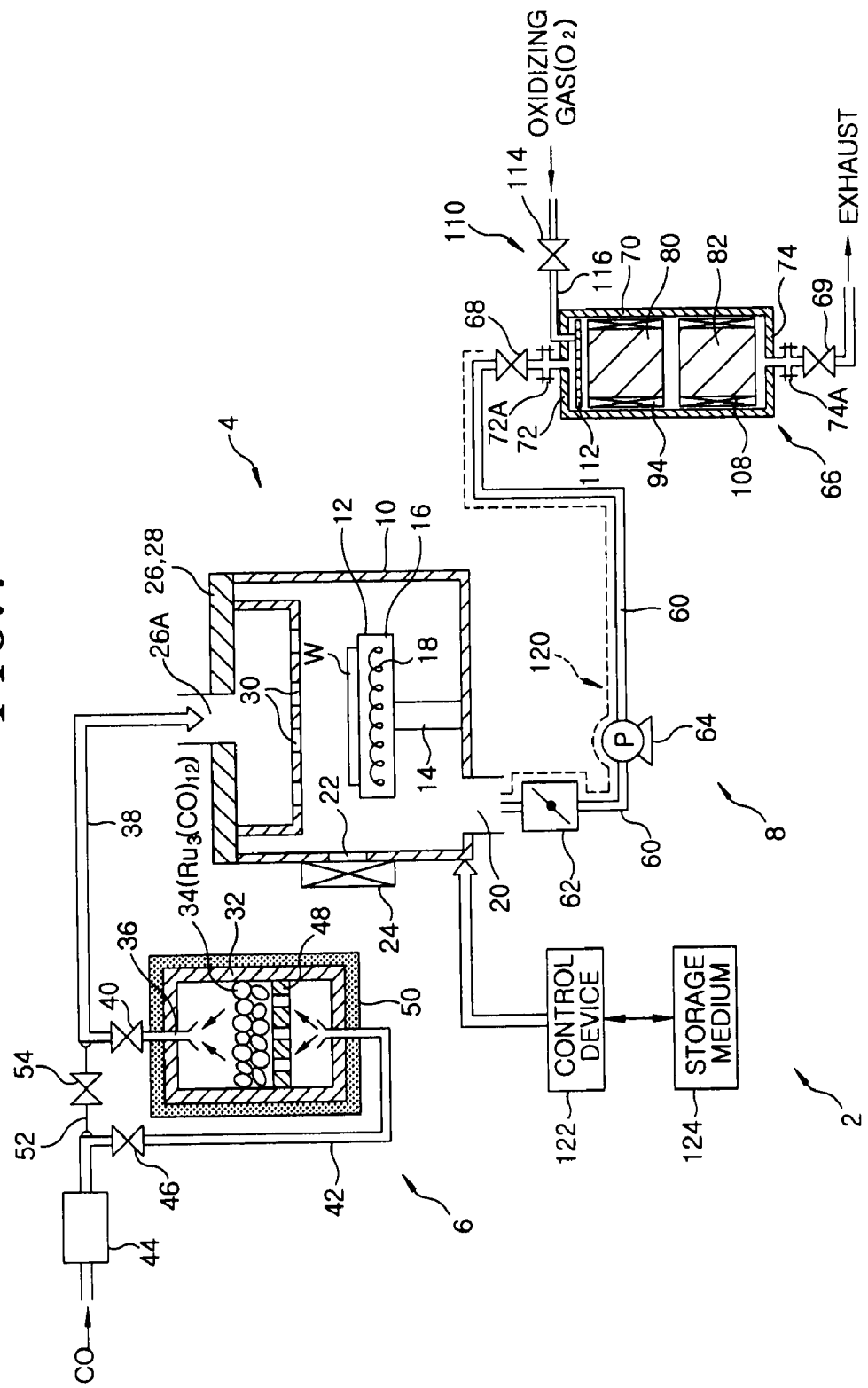
FIG. 1 is a configuration view schematically showing a film forming device including a metal recovery apparatus in accordance with an embodiment of the present invention.
Figure 2:
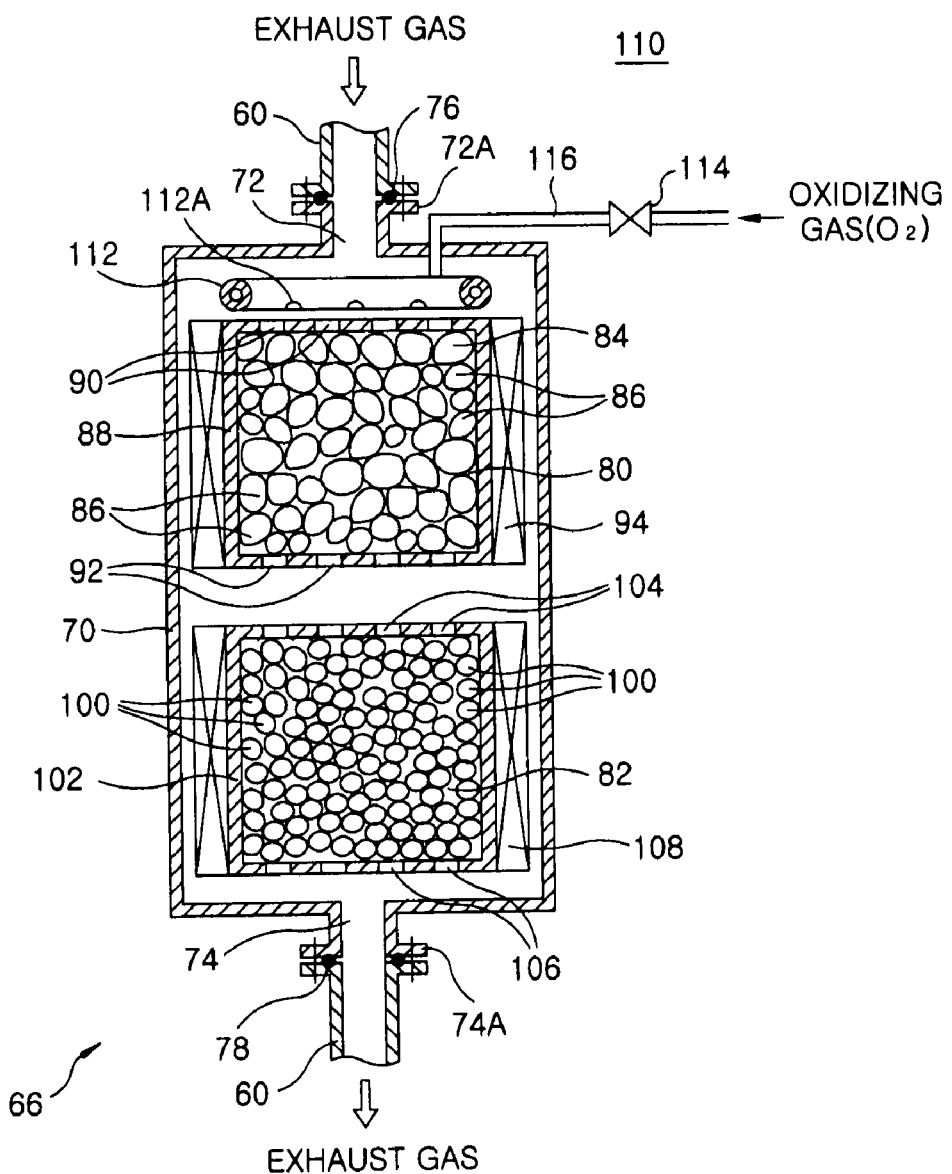
FIG. 2 is an enlarged cross-sectional view showing an example of a configuration of the metal recovery apparatus.

Hereinafter, a metal recovery method, a metal recovery apparatus, a gas exhaust system and a film forming device using the same in accordance with an embodiment of the present invention will be described in detail with reference to the accompanying drawings. FIG. 1 is a configuration view schematically showing a film forming device including a metal recovery apparatus, and FIG. 2 is an enlarged cross-sectional view showing an example of a configuration of the metal recovery apparatus. In the present embodiment, a carbonyl organic metal compound, e.g., $Ru_3(CO)_{12}$, is used as a source of an organic metal compound, and carbon monoxide (CO) gas is used as a carrier gas. Further, a thin film formed of a Ru metal film is formed.

As shown in FIG. 1, a film forming device 2 of the present embodiment mainly includes a device main body 4 for performing a film forming process on a semiconductor wafer W as a target substrate to be processed; a source gas supply system 6 for supplying a film-forming source gas to the device main body 4; and a gas exhaust system 8 for exhausting an exhaust gas from the device main body 4.

First, the device main body 4 will be described. The device main body 4 includes a cylindrical processing chamber 10 formed of, e.g., an aluminum alloy. In the processing chamber 10, a holding unit 12 for holding thereon the semiconductor wafer W as the target substrate is provided. Specifically, the holding unit 12 includes a support column uprightly installed at a bottom portion of the device main body 4; and a disc-shaped mounting table 16 supported by the support column 14. The wafer W is mounted on the mounting table 16. The mounting table 16 is formed of, e.g., a ceramic material such as aluminum nitride (AlN). Further, in the mounting table 16, a heater 18 formed of, e.g., a tungsten wire is provided to heat the wafer W. In this regard, the heater 18 is not limited to such tungsten wire heater, but a heating lamp, for example, may be used as the heater 18.

A gas exhaust port 20 is provided at a bottom portion of the processing chamber 10, and the gas exhaust system 8 is connected to the gas exhaust port 20 so that the atmosphere in the processing chamber 10 can be evacuated to a vacuum level. The gas exhaust system 8 will be described later. An opening 22 through which the wafer W is loaded and unloaded is formed on a sidewall of the processing chamber 10, and a gate valve 24 is provided in the opening 22 to airtightly open and close the opening 22.

Provided on a ceiling portion of the processing chamber 10 is a gas introduction mechanism 28 including, e.g., a shower head 26 and gas injection holes 30, through which a necessary gas is supplied to the processing chamber 10, is provided at the bottom of the gas introduction mechanism 28. Further, the source gas supply system 6 and, if necessary, another gas supply system are connected to the gas inlet 26A of the shower head 26. Depending on kinds of the employed gases, the source gas and one or more different gases may be mixed in the shower head 26 or may be individually introduced to the shower head 26 and mixed in the processing chamber 10. In the present embodiment, although the shower head 26 is used as the gas introduction mechanism 28, a simple nozzle may be used alternatively.

Next, the source gas supply system 6 will be described. First, the source gas supply system 6 includes a source tank for storing a solid or liquid source. In the present embodiment, an organic metal compound source, e.g., a solid source 34, is stored in the source tank 32. As described above, $Ru_3(CO)_{12}$ is employed as the solid source 34. The solid source 34 typically has a very low vapor pressure, so that it is difficult to evaporate the solid source 34. Alternatively, a liquid source from which a source gas is produced by bubbling or the like may be used instead of the solid source 34.

In addition, a source passageway 38 is provided by respectively connecting one end thereof and the other end thereof to a gas outlet 36 provided at a ceiling portion of the source tank 32 and the gas inlet 26A of the shower head 26 of the device main body 4 to supply a source gas produced in the source tank 34. Further, an on-off valve 40 is provided at a portion of the source passageway 38, close to the source tank 32.

Connected to a lower side of the source tank 32 is a carrier gas line 42 through which a carrier gas is supplied to the source tank 32. In the carrier gas line 42, a mass flow controller 44 and a carrier gas on-off valve 46 are successively arranged so that a source gas is produced therein by heating and thus evaporating the solid source 34 while supplying the carrier gas thereto at a controlled flow rate.

In the source tank 32, a porous plate 48 is provided around the side at which the carrier gas line 42 is installed. The solid source 34 is held on the porous plate 48, and the carrier gas supplied from the carrier gas line 42 is uniformly transferred to the source tank 32 through holes formed on the porous plate 48. In the present embodiment, carbon monoxide (CO) gas is used as the carrier gas.

A tank heating mechanism 50 is provided so as to completely cover the source tank 32 in order to heat the source tank 32 and thus promote the evaporation of the solid source 34. The temperature at which the solid source 34 is heated is lower than that at which the solid source 34 is decomposed. Further, a bypass line 52 is provided to allow an upstream side of the carrier gas on-off valve 46 of the carrier gas line 42 to communicate with a downstream side of the on-off valve 40 of the source passageway 38. In the bypass line 52, a bypass on-off valve 54 is arranged to supply the carrier gas by bypassing the source tank 32 if necessary. Besides, in the source passageway 38, a heating mechanism (not shown) such as a tape heater is provided to heat the source passageway 38 such that the source gas is prevented from being re-solidified.

Next, the gas exhaust system 8 will be described. The gas exhaust system 8 includes an exhaust path 60 connected to the gas exhaust port 20 of the processing chamber 10 so as to exhaust a gas from the processing chamber 10 along the exhaust path 60. Specifically, in the exhaust path 60, a pressure control valve 62, a vacuum pump 64 and a metal recovery apparatus 66 are successively arranged in the direction from an upstream side thereof to a downstream side thereof.

The pressure control valve 62 is formed of, e.g., a butterfly valve to control the pressure inside the processing chamber 10. In the present embodiment, the vacuum pump 64 includes, e.g., a turbo molecular pump and a dry pump together to evacuate the atmosphere in the processing chamber 10 to a vacuum level.

The metal recovery apparatus 66 decomposes an unreacted source gas included in the exhaust gas flowing through the exhaust path 60 by exposing it to high temperature to recover metal components therefrom and performs the scrubbing operation by oxidizing harmful components of the exhaust gas. In the present embodiment, almost all of the unreacted source gas, i.e., $Ru_3(CO)_{12}$ gas, is recovered. Such configuration will be described below.

First, on-off valves 68 are respectively provided at portions of the exhaust path 60 which are positioned at an upstream side and a downstream side of the metal recovery apparatus 66. Accordingly, in the maintenance of the metal recovery apparatus 66, the metal recovery apparatus 66 is separated from the exhaust path 60 by closing the on-off valves 68.

As shown in FIG. 2, the metal recovery apparatus 66 includes, e.g., a cylindrical housing 70 made of stainless steel or the like. A gas inlet 72 is formed at an upper portion of the housing 70, and a gas outlet 74 is formed at a lower portion thereof. Flanges 72A and 74A are respectively formed in the gas inlet 72 and the gas outlet 74. Further, the gas inlet 72 and the gas outlet 74 are respectively airtightly connected to the exhaust path 60 at the upstream and downstream side of the metal recovery apparatus 66 via sealing members 76 and 78 such as O rings by the flanges 72A and 74A.

In the cylindrical housing 70, a trap unit 80 and a scrubbing unit 82 are successively arranged along the flowing direction of the exhaust gas. The trap unit 80 serves to expose an exhaust gas to high temperature and thus thermally decompose an unreacted source gas included in the exhaust gas to trap metal components included in the source gas. The scrubbing unit 82 serves to perform the scrubbing operation by oxidizing harmful gas components included in the exhaust gas which has flowed through the trap unit 80.

Specifically, the trap unit 80 includes an adsorption member 84 for adsorbing the metal components obtained by the thermal decomposition. In the present embodiment, the adsorption member 84 includes a plurality of adsorption pieces 86 having a spherical, lump or block shape. The adsorption pieces 86 are detachably accommodated in a cylindrical casing 88 which is made of, e.g., stainless steel.

A plurality of vent holes 90 is provided at a ceiling portion of the casing 88 while a plurality of vent holes 92 is provided at a bottom portion of the casing 88 so that the exhaust gas flows through the inside of the casing 88. Further, an adsorption member heater 94 for heating the adsorption member 84 is provided at a peripheral portion of the casing 88 to heat the adsorption pieces 86 to a predetermined temperature ranging from, e.g., about 600 to 1000° C. The adsorption member heater 94 is formed of, e.g., a tungsten heater or the like.

In case that the adsorption pieces 86 have, e.g., a spherical shape, is preferable to set the diameters of the adsorption pieces 86 to be 10 mm or larger in order to achieve satisfactory ventilation of the exhaust gas flowing between the adsorption pieces 86. As for the adsorption pieces 86, e.g., silicon pieces, ceramic pieces such as aluminum nitride, alumina, or the like may be used instead of metal pieces made of stainless steel or the like.

The scrubbing unit 82 which is arranged at the downstream side of the trap unit 80 includes catalyzers 100 for performing the scrubbing process by oxidizing harmful gas components included in the exhaust gas flowing through the trap unit 80. In the present embodiment, the catalyzers 100 having spherical, lump or block shapes are detachably accommodated in a cylindrical casing 102 which is made of, e.g., stainless steel.

Vent holes 104 and 106 through which the exhaust gas flows are provided respectively at a ceiling portion and at a bottom portion of the casing 102 so that the exhaust gas which has flowed through the trap unit 80 flows through the inside of the casing 102. Further, a catalyzer heater 108 for heating the catalyzers 100 is provided at a peripheral portion of the casing 102 to heat the catalyzers 100 to a predetermined temperature ranging, e.g., from about 600 to 800° C. The catalyzer heater 108 is formed of, e.g., a tungsten heater or the like.

In case that the catalyzers 100 have, e.g., a spherical shape, it is preferable to set the diameters of the catalyzers 100 to be 5 mm or larger in order to ensure satisfactory ventilation of the exhaust gas flowing between the catalyzers 100. As for the catalyzers 100, $MnO_2$, $CaO$, $MgO$, $HfO_2$, $Ta_2O_5$ and/or the like may be used.

Connected to the housing 70 is an oxidizing gas supply mechanism 110 for supplying an oxidizing gas to the housing 70. In the present embodiment, the oxidizing gas supply mechanism 110 includes a circular ring-shaped shower head 112 provided at a ceiling portion of the housing 70, i.e., a most upstream side of the exhaust gas flow in the housing 70. A gas flow path 116 is connected to the shower head 112, and an on-off valve 114 is arranged in the gas flow path 116. Further, a plurality of gas injection holes 112A are formed in the shower head 112 so that an oxidizing gas is supplied through the gas injection holes 112A toward substantially entire surface of an upstream side of the trap unit 80 at a controlled flow rate.

The oxidizing gas supplied from the shower head 112 flows through both the trap unit 80 and the scrubbing unit 82 arranged under the trap unit 80. Here, in case that the oxidizing gas flows through only the scrubbing unit 82, the shower head 112 of the oxidizing gas supply mechanism 110 may be preferably provided between the trap unit 80 and the scrubbing unit 82. As for the oxidizing gas, $O_2$ gas may be used. The configuration of the oxidizing gas supply mechanism 110 is not limited to the above embodiment.

A passage heater 120 such as a tape heater is provided in each member arranged in the exhaust path 60 extended from the gas exhaust port 20 of the processing chamber 10 to the metal recovery apparatus 66. Accordingly, the exhaust gas flowing through the exhaust path 60 is heated to, e.g., about nor to prevent an unreacted source gas included in the exhaust gas from being condensed (solidified) in the middle of the exhaust pipe 60, wherein the temperature may be set based on an employed source.

The control of the general operations, such as the start and stop of the supply of gas, process temperature and process pressure, and the supply of oxidizing gas or the like, of the film forming device 2 with such configuration is performed by a computer-based control device 122.

A computer-readable program necessary for such control is stored in a storage medium such as a flexible disc, a compact disc (CD), a CD-ROM, a hard disk drive, a flash memory or the like. If necessary, an auxiliary trap mechanism for auxiliarily trapping some of the unreacted source gas may be provided at an upstream side of the metal recovery apparatus 66.

Figure 3:
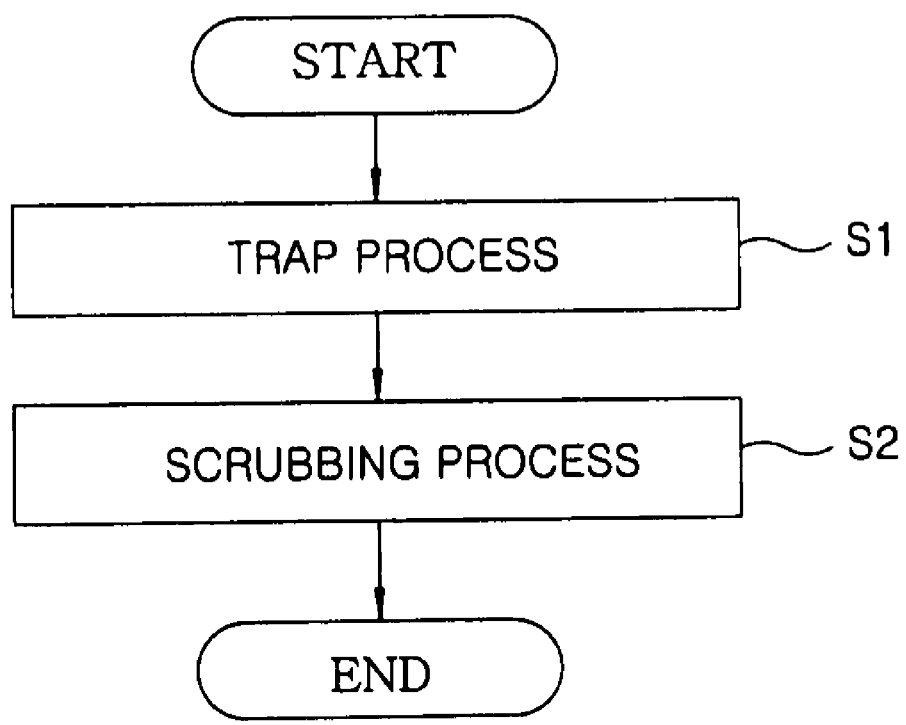
FIG. 3 is a flowchart showing a metal recovery method in accordance with the embodiment of the present invention.
Figure 4A:
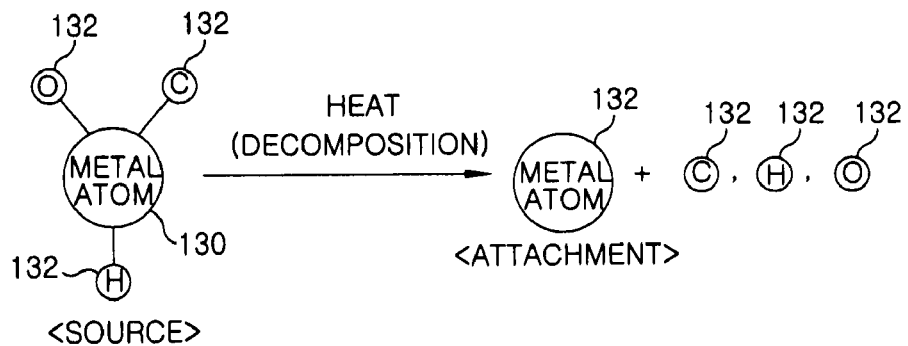
FIG. 4A is a schematic view for explaining a general situation in which a source gas is thermally decomposed and metal components are trapped.
Figure 4B:
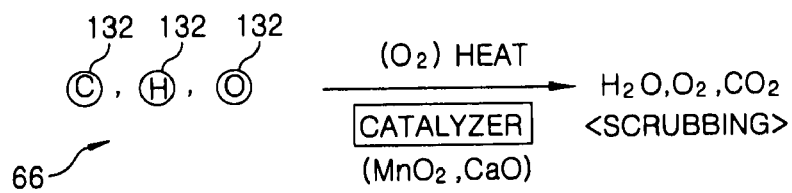
FIG. 4B is a schematic view for explaining a general situation in which a harmful gas is scrubbed.
Figure 5A:
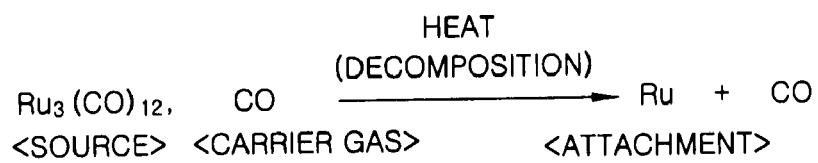
FIG. 5A is a schematic view for explaining a situation in which $Ru_3(CO)_{12}$ gas serving as a source gas is thermally decomposed and metal components are trapped.
Figure 5B:
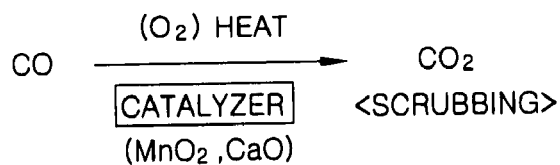
FIG. 5B is a schematic view for explaining a situation in which a harmful gas produced when $Ru_3(CO)_{12}$ gas is thermally decomposed is scrubbed.

Next, an operation of the film-forming device 2 having such configuration will be described with reference to FIGS. 3 to 5B mainly. FIG. 3 is a flowchart showing a metal recovery method in accordance with the embodiment of the present invention, and FIGS. 4A and 4B are schematic views showing a general situation in which a source gas is thermally decomposed and metal components are trapped, and a thus-produced harmful gas is scrubbed. FIGS. 5A and 5B are schematic views showing situations in which $Ru_3(CO)_{12}$ gas as a source gas is thermally decomposed and metal components are trapped, and a thus-produced harmful gas is scrubbed.

As shown in FIG. 1, in the main body 4 of the film-forming device 2, the vacuum pump 64 of the gas exhaust system 8 is continuously operated such that the processing chamber 10 is evacuated to a predetermined pressure, and the semiconductor wafer W mounted on the mounting table 16 is heated by the heater 18 to maintain the temperature of the semiconductor wafer W at a predetermined level. Further, the shower head 26 and the sidewall of the processing chamber 10 are respectively heated by heaters (not shown) provided at the processing chamber 10 to maintain the temperature thereof at a predetermined level.

The entire source gas supply system 6 has already been heated to a predetermined temperature by the tank heating mechanism 50 and a passage heater (not shown). When the film formation is started, in the source gas supply system 6, by supplying a carrier gas (CO) into the source tank 32 at a controlled flow rate through the carrier gas line 42, the solid source 34 stored in the source tank 32 is heated and thus vaporized, thereby producing a source gas.

The produced source gas flows to the downstream side in the source passageway 38 together with the carrier gas. Then, the source gas is introduced from the shower head 26 of the film forming main body 4 into the processing chamber whose atmosphere is evacuated. Thereafter, in the processing chamber 10, a Ru metal thin film is formed on the wafer W by employing, e.g., the chemical vapor deposition (CVD). At this time, the process conditions are as follows. The process pressure, the wafer temperature, and the sidewall temperature of the processing chamber 10 are respectively set to about 0.1 Torr (13.3 Pa), about 200 to 250° C., and about 75 to 80° C.

Here, the solid source 34, e.g., $Ru_3(CO)_{12}$, is a source that is difficult to vaporize due to its significantly low vapor pressure. Further, a very small amount of the $Ru_3(CO)_{12}$ contributes to the film-forming reaction, and about 90% thereof flow to the downstream side without making reactions through the exhaust path 60 of the gas exhaust system 8 together with the carrier gas, i.e., CO gas. Such reactions are represented by the following chemical equations. Under the reactions, the same kind of gas, i.e., CO gas, as the carrier gas is produced.

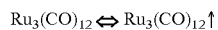

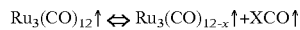

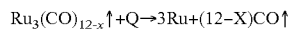

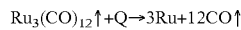

Here, the symbol '⇔' indicates the reversible reaction, and the symbol '↑' indicates the gaseous state. Those without the symbol '↑' indicate the solid state. Further, "Q" indicates the quantity of heat.

When flowing to the downstream side in the exhaust path 60 before being discharged to the atmosphere, the exhaust gas successively flows through the pressure control valve 62, the vacuum pump 64 and the metal recovery apparatus 66. In this case, after the metal components of the unreacted source gas are recovered in the metal recovery apparatus 66, only the CO gas remains as the exhaust gas. Further, the CO gas is oxidized in the metal recovery apparatus 66 and thus becomes $CO_2$ gas to be discharged to the atmosphere.

Hereinafter, the process to be performed on the exhaust gas in the metal recovery apparatus 66 will be described in detail. As shown in FIG. 3, the process includes a trap process (step 1) and a scrubbing process (step 2). In the trap process (step S1), an unreacted source gas included in the exhaust gas is thermally decomposed by exposing the exhaust gas to high temperature, so that metal components included in the source gas are attached on the adsorption member 84. Then, in a scrubbing process (step S2), harmful gas components included in the exhaust gas are oxidized and thus scrubbed by bringing the exhaust gas that has been subjected to the trap process into contact with the catalyzer 100.

Specifically, the exhaust gas flowing in the exhaust path 60 is introduced into the housing 70 through the gas inlet 72 provided at the ceiling portion of the metal recovery apparatus 66. Then, the introduced exhaust gas flows to the downstream side therein while being brought into contact with the surfaces of the adsorption pieces 86. Here, by the adsorption member heater 94, the adsorption pieces 86 have been heated to a predetermined temperature ranging, e.g., from about 600 to 1000° C., at which temperature an unreacted source gas can be thermally decomposed. Accordingly, the source gas, i.e., the $Ru_3(CO)_{12}$ gas, is thermally decomposed into "Ru" and "Co." The metal components "Ru" is attached and trapped on the surface of the adsorption pieces 86 which have been heated to a high temperature.

Such situation is schematically shown in FIGS. 4A and 5A. As shown in FIG. 4A, if the source gas in which ligands 132 are coupled to metal atoms 130, for example, is exposed to high temperature, the source gas is thermally decomposed into the metal atoms 130 and the ligands 132. Further, the metal atoms 130 are attached on the surfaces of the adsorption pieces 86 which have been heated to a high temperature. The ligands 132 include at least one, preferably two, of carbon, oxygen, and hydrogen without including halogen elements such as fluorine or chlorine.

Moreover, as shown in FIG. 5A, since $Ru_3(CO)_{12}$ and CO gas are respectively used as the source and the carrier gas in the present embodiment, the metal components, i.e., Ru, are separated and the ligands are eliminated, thereby producing CO gas. The carrier gas, i.e., CO gas, remains as it is.

As such, while the exhaust gas flows through the trap unit 80, the metal components of the exhaust gas are trapped. The exhaust gas thus containing the CO gas, i.g., harmful gas, flows into the scrubbing unit 82 provided at the downstream side. Then, the exhaust gas flows in the scrubbing unit 82 while being brought into contact with, e.g., the catalyzer, e.g., $MnO_2$ and/or CaO which is heated to a high temperature ranging, e.g., from about 600 to 800° C. by the catalyzer heater 108.

Meanwhile, since oxidizing gas, e.g., $O_2$ gas, has been introduced into the housing 70 from the oxidizing gas supply mechanism 110 provided at the ceiling portion of the housing 70, the exhaust gas also contains the $O_2$ gas. Accordingly, the oxidizing reaction between the harmful gas, i.e., the CO gas, and the $O_2$ gas is expedited by the catalytic action of the catalyzer 100, thereby becoming $CO_2$ gas to be scrubbed.

In general, as shown in FIG. 4B, for example, the ligands 132 containing carbon, oxygen and hydrogen are oxidized with the $O_2$ gas, thereby becoming $CO_2$, $H_2O$ or $O_2$ to be scrubbed. In the present embodiment, as shown in FIG. 53, the CO components are oxidized, thereby becoming $CO_2$ to be scrubbed. In this way, if the harmful gas is scrubbed, the exhaust gas contains only stable gas components, such as $CO_2$, $H_2O$ and $O_2$, which are not harmful to human bodies even when it is discharged to the atmosphere. Accordingly, the exhaust gas exhausted from the metal recovery apparatus 66 is discharged to the atmosphere as it is.

The metal components attached on the adsorption pieces 86 are recovered and re-used by regularly replacing the trap unit 80. Further, since they are not attached on the catalyzer 100 of the scrubbing unit 82, the catalyzer 100 is repeatedly usable semi-permanently.

Actually, a Ru thin film was formed by the film forming device 2 by using $Ru_3(CO)_{12}$ as the source, and the concentration of CO gas included in an exhaust gas was measured. As a result, the CO concentration at the gas inlet 72 of the metal recovery apparatus 66 was 200 ppm (carrier gas CO: 100 sccm, dry pump $N_2$: 50 liter), but the CO concentration at the gas outlet 74 thereof was 0 ppm. Accordingly, it was confirmed that the exhaust gas was completely scrubbed.

As such, in accordance with the present embodiment, when metal components are recovered from an exhaust gas exhausted from the processing chamber 10 in which a thin film is formed on a target substrate, e.g., the semiconductor wafer W, by using a source gas formed of an organic metal compound source, e.g., $Ru_3(CO)_{12}$, the exhaust gas is subjected to both the trap process in which an unreacted source gas included in the exhaust gas is thermally decomposed by bringing the exhaust gas into contact with the heated adsorption member 84 and, thus, the metal components included in the source gas are attached on the adsorption member 84; and the scrubbing process in which harmful gas components included in the exhaust gas that has been subjected to the trap process are oxidized and thus scrubbed by bringing the exhaust gas into contact with the catalyzer 100. Accordingly, by using the metal recovery apparatus having a space-saved simple configuration, it is possible to recover metal components from the exhaust gas exhausted from the processing chamber in which a thin film is formed on the surface of a target substrate and scrub the exhaust gas.

In addition, since the recovered metal components are re-used without being wasted, the running cost can be reduced accordingly. Besides, to re-use the metal components, it is not required to perform a complex purifying operation, and it is possible to simply obtain the metal components as the source.

Further, in the metal recovery apparatus for recovering metal components from the exhaust gas exhausted from the processing chamber 10 in which a thin film is formed on a surface of a target substrate by using the source gas formed of the organic metal compound source, the trap unit 80 including the adsorption member 84 for attaching thereon the metal components included in the source gas by exposing the exhaust gas to high temperature and thus thermally decomposing the unreacted source gas included in the exhaust gas is integrated with the scrubbing unit 82 including the catalyzer 100 for oxidizing and thus scrubbing harmful gas components included in the exhaust gas that has flowed through the trap unit 80. Accordingly, it is possible to significantly reduce the installation space.

(Modification of Trap Unit)

Figure 6A:
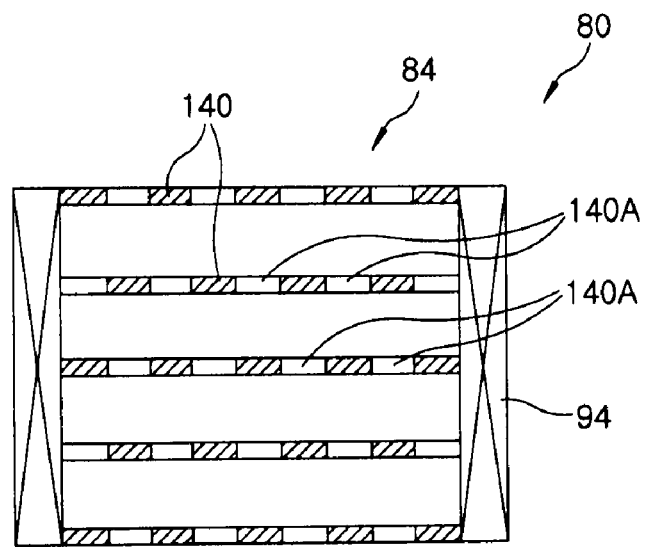
FIG. 6A schematically shows a modification of a trap unit.
Figure 6B:
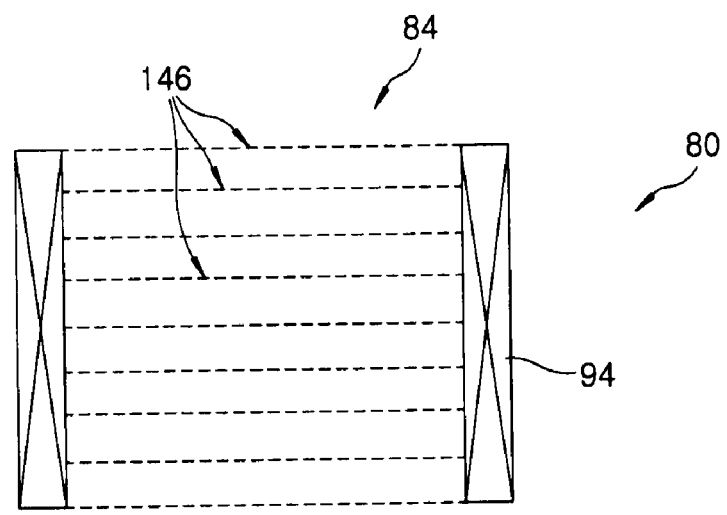
FIG. 6B schematically shows another modification of a trap unit.

Next, a modification of the trap unit 80 will be described. The adsorption pieces 86 having, e.g., spherical shapes are used as the adsorption member 84 in the trap unit 80 of the metal recovery apparatus 66 shown in FIG. 2, but the present invention is not limited thereto. The trap unit 80 may have the following structure. FIGS. 6A and 6B schematically show structures of trap units in accordance with modifications. In FIGS. 6A and 6B, components having substantially the same configuration and function as those shown in FIG. 2 are denoted by like reference characters, and thus redundant description thereof will be omitted herein.

FIG. 6A shows a first modification of the trap unit 80, in which a plurality of punched plates 140 are used as the adsorption member 84. A plurality of vent holes 140A are formed on the entire surfaces of the punched plates 140. The punched plates 140 are arranged at a predetermined pitch in a flowing direction of the exhaust gas.

At this time, the vertically adjacent punched plates 140 respectively have the vent holes 140A that are misaligned in the left-right or front-backward direction. Accordingly, the exhaust gas flows non-straightly through the punched plates 140, so that the exhaust gas is efficiently brought into contact with the surfaces of the punched plates 140.

The adsorption member heater 94 is provided at a side portion of each of the punched plates 140 to heat each of the punched plates 140. As for the material of the punched plates 140, e.g., stainless steel, ceramic or the like may be used. In accordance with the first modification, it is also possible to obtain the same operation and effect as those of the above embodiment and attach metal components of the exhaust gas to be trapped.

FIG. 6B shows a second modification of the trap unit 80. In the second modification, a plurality of wire nets 146 is used as the adsorption member 84. The wire nets 146 are arranged at a predetermined pitch in a flowing direction of the exhaust gas.

The adsorption member heater 94 is provided at a side portion of each of the wire nets 146 to heat each of the wire nets 146. As for the material of the wire nets 146, e.g., stainless steel, tungsten or the like may be used. In accordance with the second modification, it is also possible to obtain the same operation and effect as those of the above embodiment and attach metal components of the exhaust gas to be trapped.

In the above embodiments, the case of using $MnO_2$ and/or CaO as the catalyzer 100 is taken as an example. However, as for the catalyzer 100, at least one selected from the group consisting of $MnO_2$, CaO, MgO, $HfO_2$, $Ta_2O_5$ may be used without the limitation to $MnO_2$ and CaO. Moreover, although $O_2$ gas is used as the oxidizing gas in the above embodiments, at least one selected from the group consisting of $O_2$ gas, $O_3$ gas, $H_2O$ gas and the air (gaseous mixture of oxygen and nitride) without the limitation to $O_2$ gas may be used.

Further, in the above embodiments, the case of using $Ru_3(CO)_{12}$ as the organic metal compound source is taken as an example. However, as for the organic metal compound source, at least one selected from the group consisting of tetrakis(ethylmethylamino)titanium($Ti[N(C_2H_5CH_3)_2]_4$ (TEMAT), tert-amylimidotrisdim-ethylamidotantalum (TAIMATA), $Cu(EDMDD)_2$, $W(CO)_6$, $TaCl_5$, trimethyl aluminum (TMA), tert-butylimidotris(diethylamido)tantalum (TBTDET), polyethylene terephthalate (PET), tetramethylsilane (TMS), tetrakisethoxy hafnium (TEH), $CP_2Mn[=Mn(C_5H_5)_2]$, $(MeCp)_2Mn[=Mn(CH_3C_5H_4)_2](EtCp)_2Mn[=Mn(C_2H_5C_5H_4)_2]$, $(i-PrCp)_2Mn[=Mn(C_3H_7C_5H_4)_2]$, $MeCpMn(CO)_3[(CH_3C_5H_4)Mn(CO_3)]$, $(t-BuCP)_2Mn[=Mn(C_4H_9C_5H_4)_2]$, $CH_3Mn(CO)_5$, $Mn(DPM)_3[=Mn$ $(C_{11}H_{19}O_2)_3$], Mn(DMPD)(EtCp)[=Mn$(C_7H_{11}C_2H_5C_5H_4)$], Mn(acac)$_2$[=Mn$(C_5H_7O_2)_2$], Mn(DPM)$_2$[=Mn$(C_{11}H_{19}O_2)_2$], and Mn (acac)$_3$[=Mn$(C_5H_7O_2)_3$], which contain no halogen element, may be used.

Each of such materials contains ligands having, e.g., carbon, oxygen and hydrogen as well as metal components. In this case, if the halogen element such as fluorine, chlorine and/or the like is included in the each of the materials, it is required to undergo through the complex purifying process (operation), which is not preferable. Further, depending on the kinds of employed sources, metal oxide, e.g., Mn oxide, Ta oxide or the like, which is likely to be oxidized, may be recovered upon metal component trap. In this case, as shown in FIG. 2, it is necessary to supply an oxidizing gas from the oxidizing gas supply mechanism 110 to the trap unit 80. In addition, depending on the kinds of employed sources, a reducing gas may be used in addition to the source gas for forming the metal film. In this case, H$_2$ gas or the like is used as the reducing gas, and the H$_2$ gas or the like is also scrubbed as described above.

In the above embodiments, the semiconductor wafer is taken as an example of the target substrate. However, the semiconductor wafer includes a silicon substrate and a compound semiconductor substrate formed of, e.g., GaAs, SiC, GaN and/or the like. Furthermore, the present invention is not limited to such substrates, but is applicable to a ceramic substrate, a glass substrate used in a liquid crystal device, or the like.

What is claimed is:

1. A metal recovery method for recovering metal components from an exhaust gas exhausted from a processing chamber in which a thin film is formed on a surface of a target substrate by using a source gas formed of an organic metal compound serving as a source, and scrubbing the exhaust gas, the method comprising:
    a trap process which thermally decomposes an unreacted source gas included in the exhaust gas by bringing the exhaust gas into contact with a heated adsorption member and thus allows metal components included in the source gas to be attached on the adsorption member; and
    a scrubbing process which oxidizes and thus scrubs harmful gas components included in the exhaust gas that has been subjected to the trap process by bringing the exhaust gas into contact with a catalyzer.

2. The method of claim 1, wherein the scrubbing process is performed under the existence of an oxidizing gas.

3. The method of claim 1, wherein the trap process is performed under the existence of an oxidizing gas.

4. The method of claim 1, wherein a temperature of the catalyzer is set to range from 600 to 800° C. in the scrubbing process.

5. The method of claim 1, wherein a temperature of the adsorption member is set to range from 600 to 1000° C. in the trap process.

6. The method of claim 1, wherein the catalyzer is formed of at least one selected from a group consisting of MnO$_2$, CaO, MgO, HfO$_2$ and Ta$_2$O$_5$.

7. The method of claim 1, wherein the oxidizing gas is formed of at least one selected from a group consisting of O$_2$, O$_3$, H$_2$O and an air.

8. The method of claim 1, wherein the organic metal compound includes at least one selected from a group consisting of Ru$_3$(CO)$_{12}$, tetrakis(ethylmethylamino)titanium (Ti[N$(C_2H_5CH_3)_2$]$_4$ (TEMAT), tert-amylimidotrisdim-ethylamido tantalum (TAIMATA), Cu(EDMDD)$_2$, W(CO)$_6$, TaCl$_5$, trimethyl aluminum (TMA), tert-butylimidotris(diethylamido) tantalum (TBTDET), polyethylene terephthalate (PET), tetramethyl silane (TMS), tetrakisethoxy hafnium (TEH), CP$_2$Mn[=Mn$(C_5H_5)_2$], (MeCp)$_2$Mn[=Mn$(CH_3C_5H_4)_2$], (EtCp)$_2$Mn[=Mn$(C_2H_5C_5H_4)_2$], (i-PrCp)$_2$Mn[=Mn$(C_3H_7C_5H_4)_2$], MeCpMn(CO)$_3$[=(CH$_3$C$_5$H$_4$)Mn(CO)$_3$)], (t-BuCp)$_2$Mn[=Mn$(C_4H_9C_5H_4)_2$], CH$_3$Mn(CO)$_5$, Mn(DPM)$_3$[=Mn$(C_{11}H_{19}O_2)_3$], Mn(DMPD)(EtCP)[=Mn$(C_7H_{11}C_2H_5C_5H_4)$], Mn(acac)$_2$[Mn$(C_5H_7O_2)_2$], Mn(DPM)$_2$[=Mn$(C_{11}H_{19}O_2)_2$], and Mn(acac)$_3$[=Mn$(C_5H_7O_2)_3$].

9. The method of claim 1, wherein the organic metal compound is Ru$_3$(CO)$_{12}$, and an exhaust gas exhausted from the scrubbing process is CO$_2$ gas.

10. A metal recovery apparatus for recovering metal components from an exhaust gas exhausted from a processing chamber in which a thin film is formed on a surface of a target substrate by using a source gas formed of an organic metal compound serving as a source, and scrubbing the exhaust gas, the apparatus comprising:
    a trap unit including an adsorption member for attaching thereon metal components included in the source gas by heating the exhaust gas and thus thermally decomposing an unreacted source gas included in the exhaust gas; and
    a scrubbing unit including a catalyzer for oxidizing and thus scrubbing harmful gas components included in the exhaust gas that has flowed through the trap unit.

11. The apparatus of claim 10, wherein the trap unit and the scrubbing unit are successively arranged in a housing in a flowing direction of the exhaust gas.

12. The apparatus of claim 10, wherein the trap unit further includes an adsorption member heater for heating the adsorption member.

13. The apparatus of claim 10, wherein the scrubbing unit further includes a catalyzer heater for heating the catalyzer.

14. The apparatus of claim 10, wherein the adsorption member includes a plurality of adsorption pieces accommodated in a casing.

15. The apparatus of claim 10, wherein the adsorption member includes a plurality of wire nets arranged in a flowing direction of the exhaust gas.

16. The apparatus of claim 10, wherein the adsorption member includes a plurality of plates with vent holes arranged in a flowing direction of the exhaust gas.

17. The apparatus of claim 10, further comprising: an oxidizing gas supply mechanism for supplying an oxidizing gas toward the trap unit.

18. The apparatus of claim 10, further comprising: an oxidizing gas supply mechanism for supplying an oxidizing gas toward the scrubbing unit.

19. The apparatus of claim 10, wherein a temperature of the catalyzer is set to range from 600 to 800° C.

20. The apparatus of claim 10, wherein a temperature of the adsorption member is set to range from 600 to 1000° C.

21. The apparatus of claim 10, wherein the catalyzer is formed of at least one selected from a group consisting of MnO$_2$, CaO, MgO, HfO$_2$ and Ta$_2$O$_5$.

22. The apparatus of claim 10, wherein the oxidizing gas is formed of at least one selected from a group consisting of O$_2$, O$_3$, H$_2$O and an air.

23. The apparatus of claim 10, wherein the organic metal compound includes at least one selected from a group consisting of Ru$_3$(CO)$_{12}$, tetrakis(ethylmethylamino)titanium (Ti[N$(C_2H_5CH_3)_2$]$_4$ (TEMAT), tert-amylimidotrisdim-ethylamido tantalum (TAIMATA), Cu(EDMDD)$_2$, W(CO)$_6$, TaCl$_5$, trimethyl aluminum (TMA), tert-butylimidotris(diethylamido)tantalum (TBTDET), polyethylene terephthalate (PET), tetramethyl silane (TMS), tetrakisethoxy hafnium (TEH), CP$_2$Mn[=Mn$(C_5H_5)_2$], (MeCp)$_2$Mn[=Mn$(CH_3C_5H_4)_2$], (EtCp)$_2$Mn[=Mn$(C_2H_5C_5H_4)_2$], (i-PrCp)$_2$ Mn[=Mn($C_3H_7C_5H_4$)$_2$], MeCpMn(CO)$_3$[=($CH_3C_5H_4$)Mn(CO)$_3$], (t-BuCP)$_2$Mn[=Mn($C_4H_9C_5H_4$)$_2$], $CH_3$Mn(CO)$_5$, Mn(DPM)$_3$[=Mn($C_{11}H_{19}O_2$)$_3$], Mn(DMPD)(EtCp)[=Mn($C_7H_{11}C_2H_5C_5H_4$)], Mn(acac)$_2$[=Mn($C_5H_7O_2$)$_2$], Mn(DPM)$_2$[=Mn($C_{11}H_{19}O_2$)$_2$], and Mn(acac)$_3$[=Mn($C_5H_7O_2$)$_3$].

24. The apparatus of claim 10, wherein the organic metal compound is $Ru_3(CO)_{12}$, and an exhaust gas exhausted from the scrubbing unit is $CO_2$ gas.

25. A gas exhaust system, which is connected to a processing chamber in which a thin film is formed on a surface of a target substrate by using a source gas formed of an organic metal compound serving as a source, for recovering metal components from an exhaust gas exhausted from the processing chamber, and scrubbing the exhaust gas, the system comprising:

an exhaust path connected to a gas exhaust port of the processing chamber;

a vacuum pump arranged in the exhaust path; and the metal recovery apparatus of claim 10 arranged in the exhaust path.

26. A film forming device for forming a thin film on a target substrate, the device comprising:

an evacuatable processing chamber;

a holding unit for holding the target substrate in the processing chamber;

a heater for heating the target substrate;

a gas introduction mechanism for introducing a gas into the processing chamber;

a source gas supply system connected to the gas introduction mechanism; and the gas exhaust system of claim 25 connected to the processing chamber.

* * * * *